(12) United States Patent
Sinha et al.

(10) Patent No.: US 8,638,594 B1
(45) Date of Patent: Jan. 28, 2014

(54) INTEGRATED CIRCUITS WITH ASYMMETRIC TRANSISTORS

(75) Inventors: Shankar Sinha, Redwood City, CA (US); Shih-Lin S. Lee, San Jose, CA (US); Peter J. McElheny, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 237 days.

(21) Appl. No.: 13/110,823

(22) Filed: May 18, 2011

Related U.S. Application Data

(63) Continuation-in-part of application No. 12/629,831, filed on Dec. 2, 2009, now Pat. No. 8,482,963.

(51) Int. Cl.
*G11C 11/00* (2006.01)
*H01L 21/02* (2006.01)

(52) U.S. Cl.
USPC ........... 365/156; 365/154; 257/344; 257/408; 257/E29.266

(58) Field of Classification Search
USPC ................................................ 365/154, 156
See application file for complete search history.

(56) References Cited

U.S. PATENT DOCUMENTS

| | | | |
|---|---|---|---|
| 4,114,049 A | 9/1978 | Suzuki | |
| 4,175,290 A | 11/1979 | Harari | |
| 4,387,444 A | 6/1983 | Edwards | |
| 4,714,519 A | 12/1987 | Pfiester | |
| 4,894,801 A | 1/1990 | Saito et al. | |
| 5,175,605 A | 12/1992 | Pavlu et al. | |
| 5,296,401 A | 3/1994 | Mitsui et al. | |
| 5,363,328 A | 11/1994 | Browning, III et al. | |
| 5,576,238 A | 11/1996 | Fu | |
| 5,753,958 A | 5/1998 | Burr et al. | |
| 5,790,452 A * | 8/1998 | Lien | 365/154 |
| 5,977,591 A | 11/1999 | Fratin et al. | |
| 6,033,957 A | 3/2000 | Burns, Jr. et al. | |
| 6,097,070 A | 8/2000 | Mandelman | |
| 6,110,783 A | 8/2000 | Burr | |

(Continued)

FOREIGN PATENT DOCUMENTS

| | | |
|---|---|---|
| CN | 1192053 | 9/1998 |
| CN | 1938858 | 3/2007 |
| WO | 2005096387 | 10/2005 |

OTHER PUBLICATIONS

Sinha et al., U.S. Appl. No. 13/110,823, filed May 18, 2011.

(Continued)

*Primary Examiner* — Son Mai
(74) *Attorney, Agent, or Firm* — Treyz Law Group; Jason Tsai; Chih-Yun Wu

(57) ABSTRACT

Integrated circuits with memory elements are provided. A memory element may include a storage circuit coupled to data lines through access transistors. Access transistors may be used to read data from and write data into the storage circuit. An access transistor may have asymmetric source-drain resistances. The access transistor may have a first source-drain that is coupled to a data line and a second source-drain that is coupled to the storage circuit. The second source-drain may have a contact resistance that is greater than the contact resistance associated with the first source-drain. Access transistors with asymmetric source-drain resistances may have a first drive strength when passing a low signal and a second drive strength when passing a high signal to the storage circuit. The second drive strength may be less than the first drive strength. Access transistors with asymmetric drive strengths may be used to improve memory read/write performance.

20 Claims, 11 Drawing Sheets

(56) References Cited

U.S. PATENT DOCUMENTS

| | | | |
|---|---|---|---|
| 6,255,174 B1 | 7/2001 | Yu | |
| 6,278,290 B1 | 8/2001 | Young | |
| 6,466,489 B1 * | 10/2002 | Ieong et al. | 365/189.09 |
| 6,487,134 B2 | 11/2002 | Thoma et al. | |
| 6,501,295 B1 | 12/2002 | Burr | |
| 6,620,679 B1 | 9/2003 | Tzeng et al. | |
| 6,653,698 B2 | 11/2003 | Lee et al. | |
| 6,807,081 B2 | 10/2004 | Nii | |
| 6,949,423 B1 | 9/2005 | Ma et al. | |
| 7,193,269 B2 | 3/2007 | Toda et al. | |
| 7,307,905 B2 | 12/2007 | Najm et al. | |
| 7,332,780 B2 | 2/2008 | Matsuda et al. | |
| 7,362,606 B2 * | 4/2008 | Chuang et al. | 365/154 |
| 7,408,800 B1 | 8/2008 | Braceras et al. | |
| 7,436,696 B2 | 10/2008 | Wang et al. | |
| 7,504,850 B2 | 3/2009 | Kuboyama et al. | |
| 7,511,989 B2 | 3/2009 | Thomas et al. | |
| 7,532,501 B2 | 5/2009 | Joshi et al. | |
| 7,545,007 B2 | 6/2009 | Greer et al. | |
| 7,652,520 B2 | 1/2010 | Gatta | |
| 7,813,162 B2 * | 10/2010 | Zhu et al. | 365/154 |
| 7,876,602 B2 | 1/2011 | Lawrence et al. | |
| 7,888,959 B2 | 2/2011 | Cannon et al. | |
| 7,920,410 B1 | 4/2011 | Lee et al. | |
| 8,036,022 B2 | 10/2011 | Anderson et al. | |
| 8,116,118 B2 | 2/2012 | Thomas et al. | |
| 8,138,797 B1 * | 3/2012 | Liu et al. | 326/102 |
| 8,139,400 B2 * | 3/2012 | Bansal et al. | 365/154 |
| 8,193,062 B2 * | 6/2012 | Chang et al. | 438/275 |
| 8,216,903 B2 * | 7/2012 | Houston et al. | 438/286 |
| 8,269,284 B2 * | 9/2012 | Nil et al. | 257/368 |
| 2001/0017390 A1 | 8/2001 | Long et al. | |
| 2003/0141525 A1 | 7/2003 | Nowak | |
| 2003/0181005 A1 | 9/2003 | Hachimine et al. | |
| 2005/0224897 A1 | 10/2005 | Chen et al. | |
| 2007/0029587 A1 | 2/2007 | Greer et al. | |
| 2007/0262382 A1 | 11/2007 | Ishii et al. | |
| 2008/0308870 A1 | 12/2008 | Faul et al. | |
| 2009/0073758 A1 * | 3/2009 | Freeman et al. | 365/174 |
| 2009/0185409 A1 | 7/2009 | Bansal et al. | |
| 2010/0177556 A1 | 7/2010 | Chen et al. | |
| 2010/0244151 A1 * | 9/2010 | French et al. | 257/408 |
| 2012/0275207 A1 * | 11/2012 | Houston et al. | 365/72 |

OTHER PUBLICATIONS

Rahim et al., U.S. Appl. No. 12/568,638, filed Sep. 28, 2009.
Liu et al., U.S. Appl. No. 12/629,831, filed Dec. 2, 2009.
Liu et al., U.S. Appl. No. 12/790,660, filed May 28, 2010.
Xiang et al., U.S. Appl. No. 12/069,271, filed Feb. 8, 2008.
Kim et al., "Relaxing Conflict Between Read Stability and Writability in 6T SRAM Cell Using Asymmetric Transistors", IEEE Electron Device Letters, vol. 30, No. 8, Aug. 2009.
Zhou et al. "A Novel Hetero-Material Gate (HMG) MOSFET for Deep-Submicron ULSI Technology", IEEE Transactions on Electron Devices, vol. 45, No. 12, Dec. 1998.
Ratnakumar et al., U.S. Appl. No. 12/324,789, filed Nov. 26, 2008.
Liu et al., U.S. Appl. No. 12/324,791, filed Nov. 26, 2008.
Xiang et al., U.S. Appl. No. 60/964,917, filed Aug. 16, 2007.
Lee et al., U.S. Appl. No. 12/391,230, filed Feb. 23, 2009.

* cited by examiner

INTEGRATED CIRCUITS WITH ASYMMETRIC TRANSISTORS

This application is a continuation-in-part of application Ser. No. 12/629,831, filed Dec. 2, 2009 now U.S. Pat. No. 8,482,963, which is hereby incorporated by reference herein in its entirety.

BACKGROUND

Integrated circuits such as programmable integrated circuits may contain volatile memory elements in the form of static random access memory (SRAM) cells. In programmable integrated circuits, SRAM cells may serve as configuration random access memory (CRAM) cells. Programmable integrated circuits are a type of integrated circuit that can be programmed by a user to implement a desired custom logic function. CRAM cells are used to store configuration data supplied by the user. Once loaded, CRAM cells supply control signals to transistors to configure the transistors to implement the desired logic function.

Volatile memory elements such as SRAM and CRAM cells are typically based on cross-coupled inverters (latches). In each memory element, the cross-coupled inverters may be connected to an address transistor that is turned on when data is being read from or written into the memory element. When no data is being read from or written into the memory element, the address transistor is turned off to isolate the memory element.

There is a trend with each successive generation of integrated circuit technology to scale transistors to smaller sizes, smaller threshold voltages, and smaller power supply voltages. Lower power supply voltages and smaller devices may lead to decreased read/write margins for volatile memory elements. This can pose challenges for reliable device operation.

With conventional techniques, memory cell stability is ensured by adjusting transistor sizes and by forming transistors with asymmetric pocket implants. Redundant resources may also be provided so that defects can be bypassed by switching redundant circuitry into use. Although these approaches are sometimes satisfactory, they can lead to undesirable area overhead and increased manufacturing cost.

SUMMARY

Integrated circuits may include memory elements. A memory element may include a latching circuit (e.g., a storage circuit based on cross-coupled inverters). The latching circuit may be coupled to data lines through access transistors. The access transistors may be used to read data from and write data into the memory element.

The access transistors may be asymmetric transistors. In particular, the access transistors may be transistors with asymmetric source-drain resistances. For example, a memory element may include a latching circuit and first and second access transistors. The latching circuit may have first and second data storage nodes that store true and complementary versions of a single data bit.

The first access transistors may have a first source-drain terminal that is coupled to a first data line and a second source-drain terminal that is coupled to the first data storage node. The second access transistor may have a first source-drain terminal that is coupled to a second data line and a second source-drain terminal that is coupled to the second data storage node. The first source-drain terminals of the first and second access transistors may have resistance values that are less than the resistance values of the second source-drain terminals of the first and second access transistors (e.g., access transistor source-drain regions coupled to the first and data storage nodes may have higher contact/series resistance than the access transistor source-drain regions coupled to the first and second data lines).

Access transistors formed in this way may exhibit a first drive strength during a forward mode and a second drive strength during a reverse mode. During the forward mode, an access transistor may be used to pass a high voltage into a corresponding data storage node or may be used to expose the data storage node to a high precharge voltage. During the reverse mode, the access transistor may be used to pass a low voltage into the data storage node. Asymmetric access transistors operating in the forward mode may be weaker than asymmetric access transistors operating in the reverse mode. Access transistors with asymmetric source-drain resistances may therefore be used to improve read/write margins of memory elements.

Asymmetric access transistors may include transistors formed using asymmetric source-drain implants, asymmetric source-drain silicide deposition, asymmetric source-drain pre-amorphization implants, stress layers of different types (e.g., tensile-stress-inducing layers and compressive-stress-inducing layers), source-drain contact vias of different sizes, source-drain spacers of different lengths, asymmetric pocket implants, etc. Other arrangements such as adjusting the magnitude of power supply voltages and address signals, adjusting transistor sizing, and including read buffers may be used in conjunction with asymmetric access transistors to increase memory element read/write performance.

Further features of the present invention, its nature and various advantages will be more apparent from the accompanying drawings and the following detailed description.

DETAILED DESCRIPTION

Figure 1:
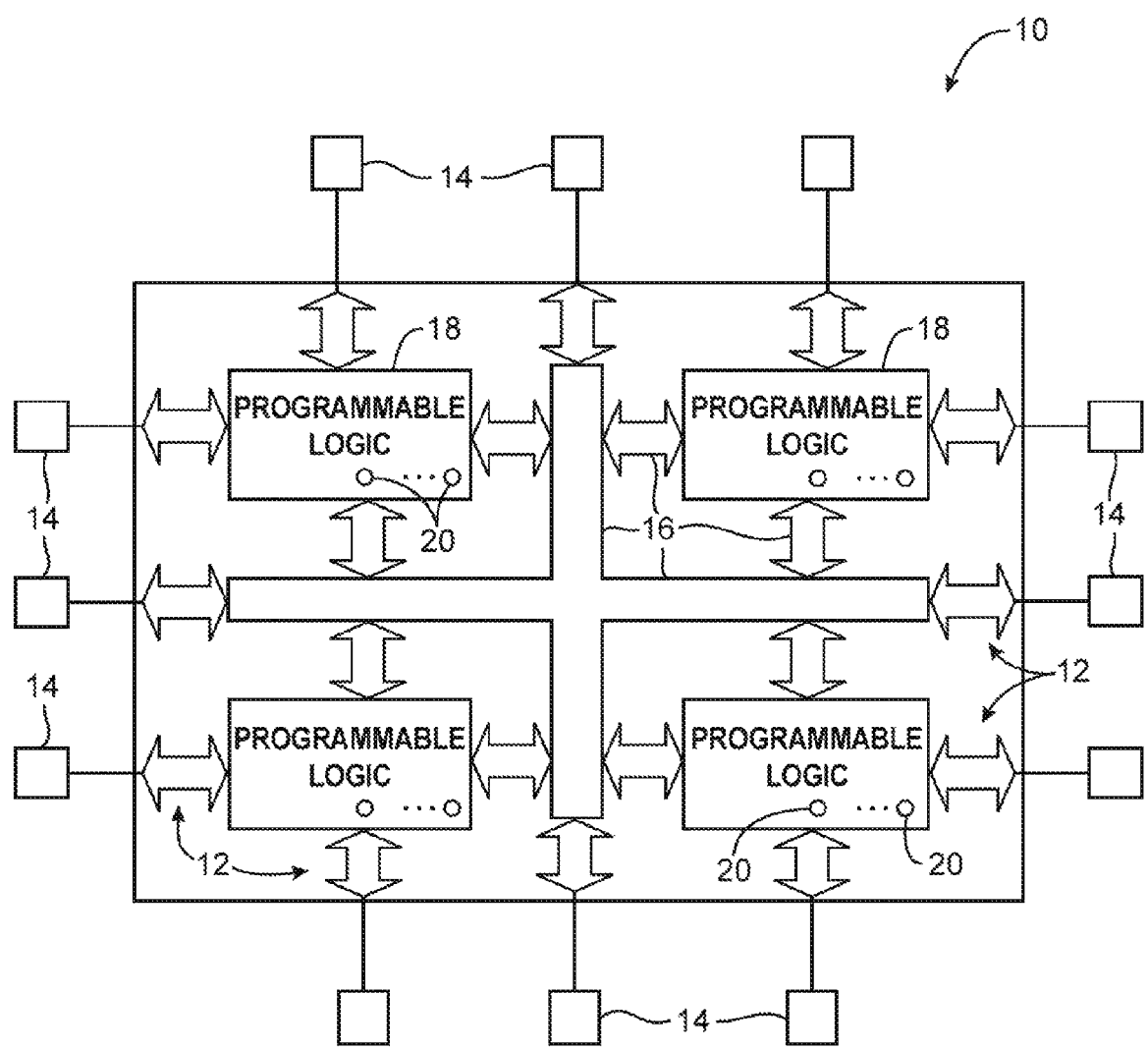
FIG. 1 is a diagram of an illustrative integrated circuit that may contain transistor structures in accordance with an embodiment of the present invention.

An illustrative integrated circuit that may contain asymmetric transistors is shown in FIG. 1. As shown in FIG. 1, integrated circuit 10 may include memory elements (cells) 20.

Memory elements 20 can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or other suitable integrated circuit. For clarity, the use of memory elements 20 is sometimes be described in the context of programmable integrated circuits such as programmable logic device integrated circuits. This is, however, merely illustrative and not intended to limit the scope of the present invention. Memory cells 20 and the asymmetric transistors in such memory cells may be used in any suitable circuits.

On integrated circuits such as memory chips or other circuits in which memory is needed to store processing data, memory elements 20 can be used to perform the functions of static random-access memory (RAM) cells and are sometimes referred to as SRAM cells. In the context of programmable logic device integrated circuits, memory elements 20 can be used to store configuration data and are therefore sometimes referred to in this context as configuration random-access memory (CRAM) cells.

As shown in FIG. 1, device 10 may have input/output (I/O) circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Integrated circuit 10 may contain memory elements 20 that are volatile. For example, integrated circuit 10 may be a programmable integrated circuit such as a programmable logic device integrated circuit that can be loaded with configuration data (also called programming data) using pins 14 and input/output circuitry 12. Once memory elements 20 are loaded in this way, the memory elements each provide a corresponding static control output signal that controls the state of an associated logic component in programmable logic 18. If desired, memory elements 20 may be used in SRAM-type memory arrays (e.g., to store data for processing circuitry during operation of device 10).

Each memory element 20 may be formed from a number of transistors configured to form a bistable circuit (i.e., a latch-type circuit). True and complement data storage nodes in the bi-stable circuit element can store corresponding true and complement versions of a data bit.

A bi-stable circuit element may be based on any suitable number of transistors. For example, the bi-stable portion of each memory element may be formed from cross-coupled inverters, from groups of multiple inverter-like circuits (e.g., in a distributed configuration that provides enhanced immunity from soft-error-upset events, etc.). Arrangements with bi-stable elements formed from cross-coupled inverter pairs are sometimes described herein as an example. This is, however, merely illustrative and not intended to limit the scope of the present invention. Memory elements 20 may be formed using any suitable memory cell architecture.

With one suitable approach, complementary metal-oxide-semiconductor (CMOS) integrated circuit technology is used to form the memory elements 20, so CMOS-based memory element implementations are described herein as an example. If desired, other integrated circuit technologies may be used to form the memory elements and the integrated circuit in which the memory elements are used to form memory arrays.

The memory elements may be loaded from any suitable source of data. As an example, memory elements 20 may be loaded with configuration data from an external erasable-programmable read-only memory and control chip or other suitable data source via pins 14 and input/output circuitry 12. Loaded CRAM memory elements 20 may provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The memory elements 20 may be arranged in an array pattern. In a typical modern integrated circuit such as a programmable integrated circuit, there may be millions of memory elements 20 on each chip. During programming operations, the array of memory elements is provided with configuration data by a user (e.g., a logic designer). Once loaded with configuration data, the memory elements 20 produce static control signals at their outputs that selectively control portions of the circuitry in the programmable logic 18 and thereby customize its functions so that it will operate as desired.

The circuitry of device 10 may be organized using any suitable architecture. As an example, the logic of device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

When memory elements 20 are arranged in an array, horizontal and vertical conductors and associated loading circuitry may be used to load the memory elements with configuration data. Any suitable memory array architecture may be used for memory elements 20. One suitable arrangement is shown in FIG. 2.

Figure 2:
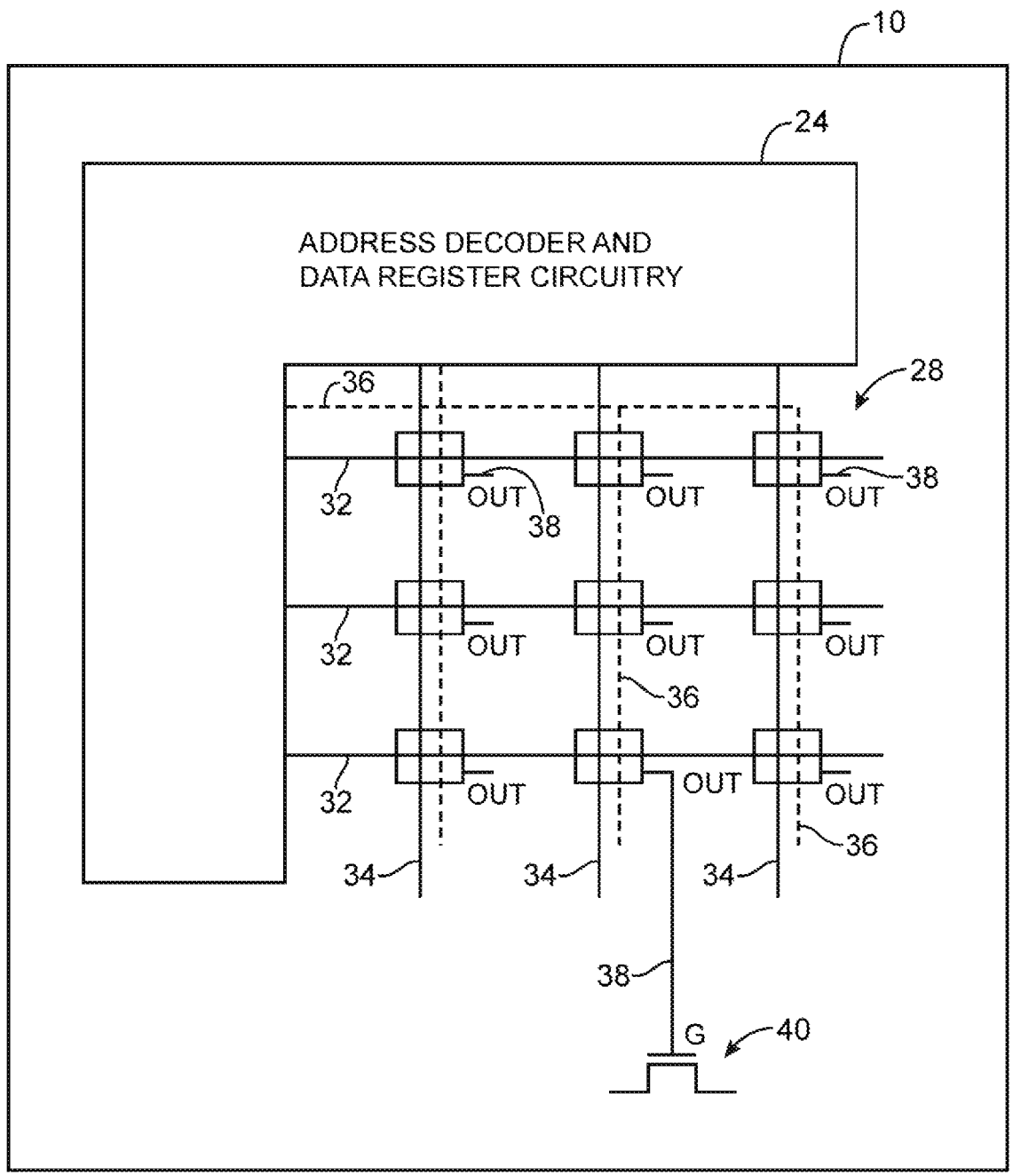
FIG. 2 is a diagram of an illustrative array of memory cells in accordance with an embodiment of the present invention.

As shown in FIG. 2, control circuitry 24 may be used to read and write data from memory cells 20 in memory cell array 28. When array 28 is being used as regular SRAM, data write operations may be performed when it is desired to store processing results and data read operations may be performed when it is desired to retrieve stored data. When array 28 is being used as CRAM, data write operations may be performed to load configuration data and data read operations may be performed to confirm that configuration data loading operations have been performed successfully.

In CRAM environments and certain SRAM environments, read speeds may be less critical than in conventional SRAM environments, because read operations may be performed relatively infrequently (e.g., mostly when confirming that configuration data has been written properly into a CRAM array). During normal operation of a circuit contains an array of CRAM cells (i.e., when CRAM cells are neither being written to or read from), the static output of each CRAM cell can be used to control a respective programmable logic component such as a transistor. For example, the output signal OUT from each cell 20 may be provided to the gate G of a corresponding pass transistor such as n-channel metal-oxide-semiconductor transistor 40 (i.e., programmable logic transistors such as transistor 40 in blocks of programmable logic 18).

Array 28 may include rows and columns of memory cells 20. In the example of FIG. 2, there are three rows and three columns of memory elements 20 in array 28. This is merely illustrative. Integrated circuits such as integrated circuit 10 may have any suitable number of memory elements 20. A typical memory array might, as an example, have thousands or millions of memory elements 20 arranged in hundreds or thousands or rows and columns.

Lines such as lines 32, 34, 36, and 38 may be used to distribute signals in array 28. One or more lines per column such as lines 34 may be used to load data into cells 20 and may be used to read data out from cells 20. Lines 34 may sometimes be referred to as data lines or bit lines. One or more lines 32 per row may be used to convey address signals and may sometimes be referred to as address lines or word lines. In some array configurations, the cells of the array may be cleared (e.g., during power-up operations). Array 28 may be cleared by writing zeros into the array using through the data lines or by asserting one or more global clear signals using a global (or nearly global) network of clear lines such as clear lines 36.

During data writing operation, write drivers in circuitry 24 may supply data to array 28 on lines 34 (e.g., in appropriate columns of the array) while appropriate address lines are asserted to define the desired array location (i.e., the appropriate rows of the array) to which the data is to be written. During read operations, appropriate address lines are asserted to define the desired array location from which data is to be read (i.e., appropriate rows) while the outputs of appropriate data lines 34 are monitored (e.g., using sense amplifiers). Single-ended and differential schemes may be used for reading and/or writing. In differential write schemes, a pair of true and complement data lines are used. In differential read schemes, a differential sense amplifier may be used in reading signals from a pair of true and complement data lines.

Memory cells 20 may include asymmetric transistors (e.g., transistors with asymmetric source-drain resistance values). Memory cells 20 that include asymmetric transistors may exhibit improved read/write performance. For example, a memory cell 20 may include a storage element (e.g., a latching circuit) and at least one access transistor coupled to the storage element. During read operations, the access transistor may be turned on to read data from the storage element. During write operations, the access transistor may be turned on to load data into the storage element.

During a read operation, it may be desirable for the access transistor to be weak relative to transistors in the storage element so that the enabled access transistor does not inadvertently flip the contents of the storage element. During a write operation, it may be desirable for the access transistor to be strong relative to the transistors in the storage element so that the enabled access transistor can overwrite the contents of the storage element. One way of providing an access transistor operable to exhibit a first drive strength during a first mode (e.g., during a read operation) and a second drive strength that is stronger than the first drive strength during a second mode (e.g., during a write operation) is to form an asymmetric access transistor. Memory cells 20 that include asymmetric access transistors may exhibit improve read/write stability.

Figure 3:
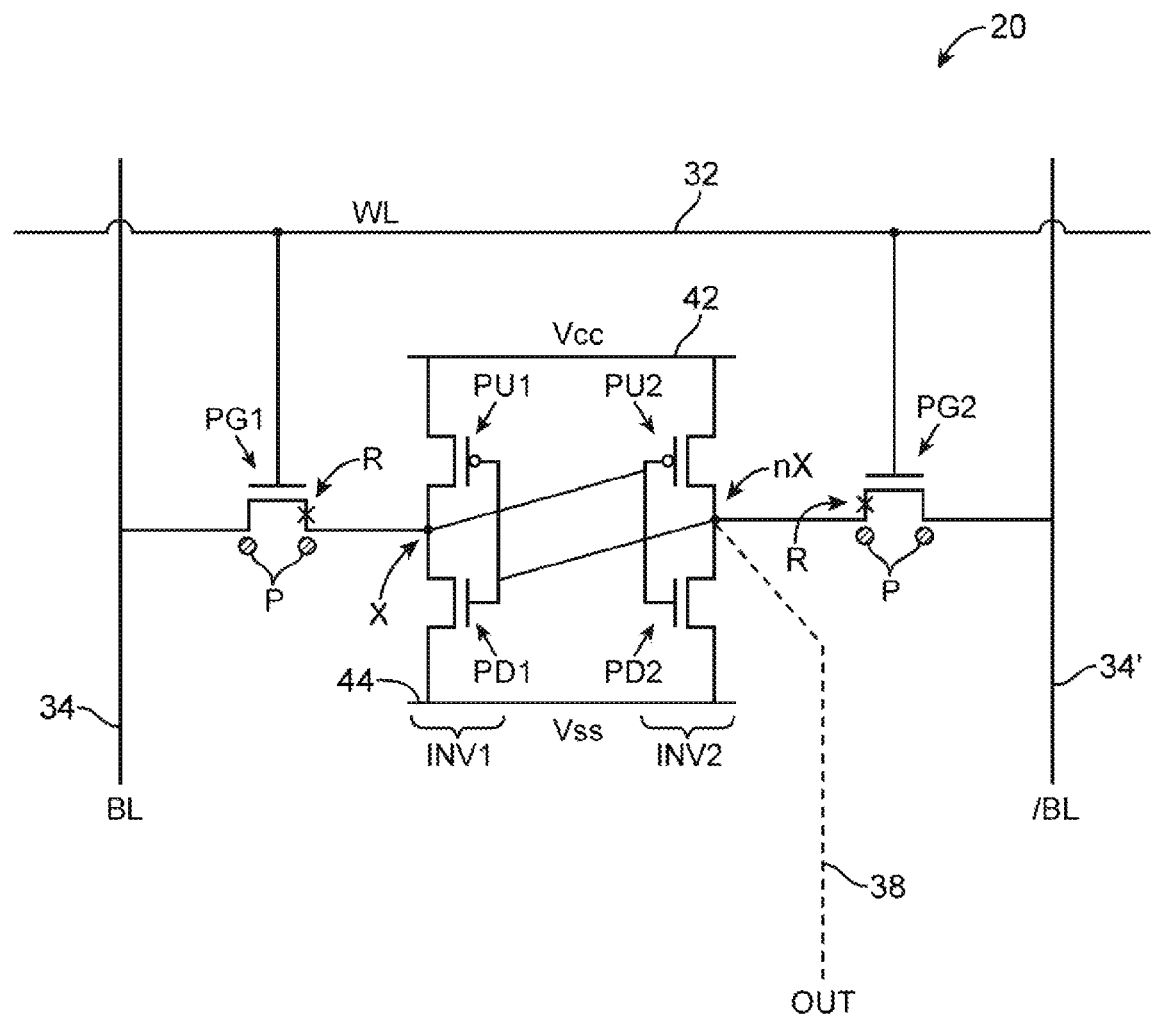
FIG. 3 is a circuit diagram of an illustrative memory cell formed using asymmetric access transistors in accordance with an embodiment of the present invention.

FIG. 3 is a circuit diagram of an illustrative memory cell 20 that may be included in device 10. As shown in FIG. 3, memory cell 20 may include access transistors PG1 and PG2 and a storage element formed from a pair of cross-coupled inverters INV1 and INV2. Inverter INV1 may include p-channel transistor PU1 and n-channel transistor PD1 coupled in series between a positive power supply line 42 (e.g., a positive power supply line on which positive power supply voltage Vcc is provided) and a ground power supply line 44 (e.g., a ground power supply line on which ground power supply voltage Vss is provided).

Inverters INV1 and INV2 may each have an input and an output. The output of INV1 may be coupled to the input of INV2, whereas the output of INV2 may be coupled to the input of INV1. The output of INV1 may serve as a first internal data storage node X, whereas the output of INV2 may serve as a second internal data storage node nX (see, e.g., FIG. 3). Data storage nodes X and nX store true and complementary versions of a single data bit. When enabled, transistors PU1 and PU2 serve to pull corresponding data storage nodes of cell 18 high and are therefore sometimes referred to as pull-up transistors. When enabled, transistors PD1 and PD2 serve to pull corresponding data storage nodes of cell 18 low and are therefore sometimes referred to as pull-down transistors. Data storage node nX of memory cell 20 may supply a static control signal OUT to a corresponding pass transistor over path 38.

An access transistor such as n-channel access transistor PG1 may be coupled between a first data line 34 (e.g., a first bit line on which bit line signal BL is provided) and data storage node X. N-channel access transistor PG2 may be coupled between a second data line 34' (e.g., a second bit line on which bit line signal /BL is provided) and data storage node nX). Access transistors PG1 and PG2 may each have a gate that is controlled by a word line signal WL (sometimes referred to as an address signal) provided over line 32. Access transistors PG1 and PG2 may be used to read data from cell 20 and to load data into memory cell 20. Access transistors PG1 and PG2 may sometimes be referred to as address transistors, read/write pass transistors, read/write pass-gate transistors, etc.

A metal-oxide-semiconductor (MOS) transistor has four terminals: a source, a drain, a gate that overlies a channel region, and a body. The source and drain are sometimes collectively referred to as source-drain terminals. By convention, the drain of an MOS transistor is typically the source-drain terminal that is biased high, whereas the source is grounded or biased at a lower voltage. Because the labels "source" and "drain" may therefore be context-sensitive, it may sometimes be clearest to refer to the both the source and the drain of a MOS transistor as being "source-drain" terminals or "source-drains."

In a symmetric transistor, the source-drain terminals of the transistors are substantially identical. It therefore does not matter whether the source-drain terminals of a symmetrical transistor are reversed, as performance will not significantly change. In an asymmetric transistor, however, the resistance at one of the source-drain terminal is substantially greater than the resistance at the other of the source-drain terminals. This leads to different performance characteristics depending on how the transistor is operated.

The access transistors (e.g., transistors PG1 and PG2 of FIG. 3) may each include symmetric pocket implants P (e.g., p-type pocket implants). Symmetric pocket implants may serve to increase the energy barrier at the respective source-drain terminals of an access transistor, thereby raising the threshold voltage associated with that access transistor. Pocket implants P need not be present in the access transistors.

As shown in FIG. 3, the access transistors may be asymmetric transistors (e.g., the access transistors may exhibit asymmetric source-drain resistance values). For example, transistor PG1 may have higher source-drain resistance at the source-drain terminal that is connected to data storage node X (as indicated by symbol R) compared to the source-drain resistance at the source-drain terminal that is connected to data line 34. Similarly, transistor PG2 may exhibit higher source-drain resistance at the source-drain terminal that is connected to data storage node nX (as indicated by symbol R) compared to the source-drain resistance at the source-drain terminal that is connected to data line 34'.

Figure 4:
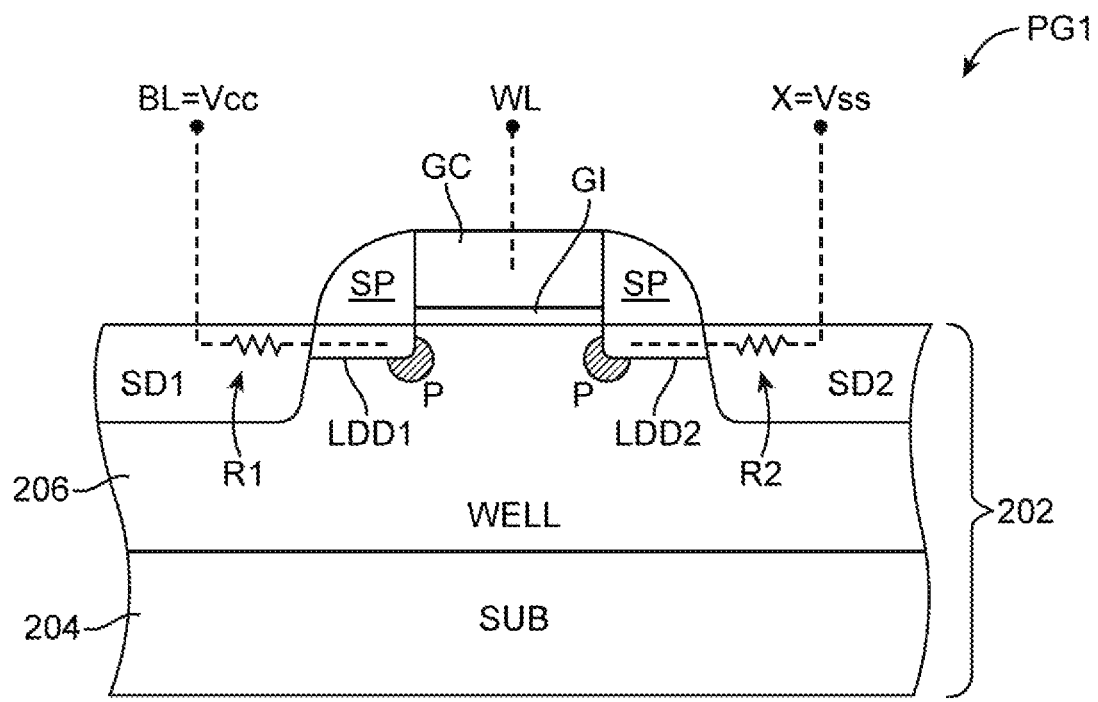
FIG. 4 is a cross-sectional side view of an illustrative asymmetric access transistor that is biased in a forward mode in accordance with an embodiment of the present invention.
Figure 5:
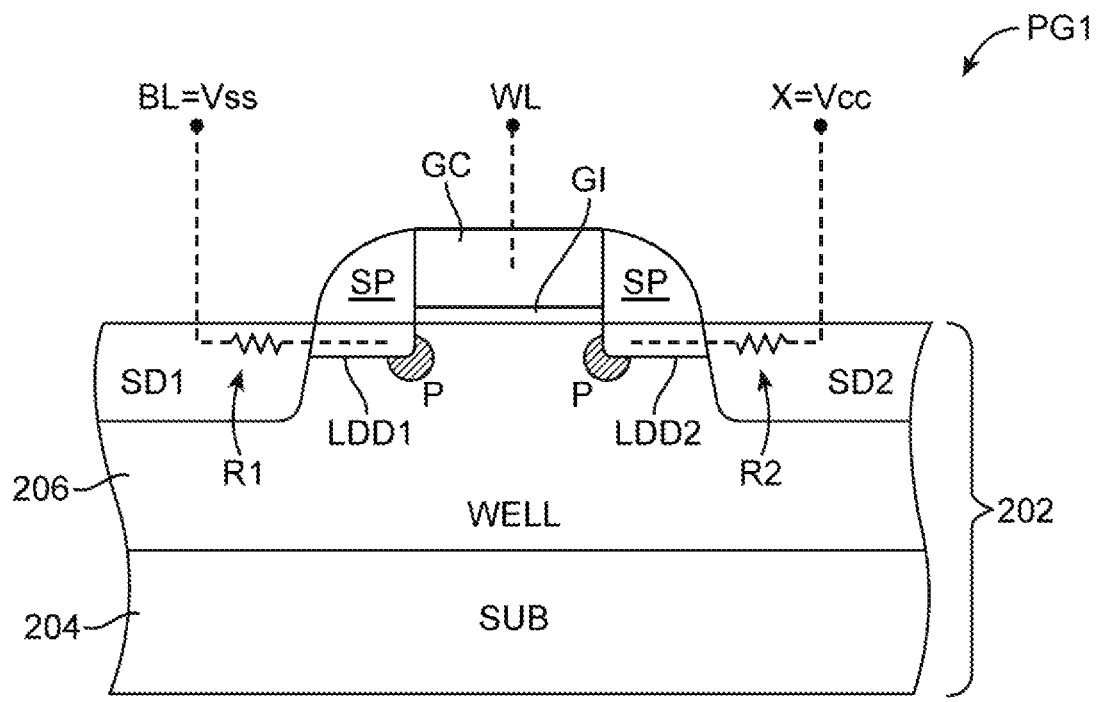
FIG. 5 is a cross-sectional side view of an illustrative asymmetric access transistor that is biased in a reverse mode in accordance with an embodiment of the present invention.

FIGS. 4 and 5 illustrate a transistor such as access transistor PG1 with asymmetric source-drain resistance (sometimes referred to herein as source-drain contact resistance or source-drain series resistance). FIG. 4 is a cross-sectional side view of transistor PG1 biased under forward mode (e.g., a mode in which the access transistor exposes a corresponding data storage node to a high voltage). As shown in FIG. 4, transistor PG1 may be formed in an integrated circuit substrate 202. Substrate 202 may be formed, for example, from a silicon wafer. Portion 204 may be a p-type substrate layer (as an example), whereas portion 206 may be a doped well (e.g., a p-well). Well 206 may form part of a well layer in the integrated circuit. If desired, other semiconductor materials (e.g., epitaxial silicon germanium sources and drains, etc.) may be used in forming the transistor structures of integrated circuit 10.

Transistor PG1 may have a conductive gate structure GC disposed over the surface of substrate 202. Gate GC may be formed from polysilicon or other gate conductors (e.g., metal, etc.). Dielectric spacers SP may be formed on opposing sides of gate GC. During ion implantation processes, source-drain regions SD1 and SD2 (sometimes referred to as heavily-doped drain regions) and pocket implants P may be formed in substrate 202. There may be a lightly doped portion in the source-drain regions such as lightly-doped drain (LDD) regions LDD1 and LDD2 under spacers SP. Gate insulator GI (e.g., silicon oxide or other dielectric) may be formed under gate GC. Transistor PG1 may have a channel region formed at the surface of well 206 that lie beneath gate insulator GI.

Source-drain terminal SD1 of transistor PG1 may be coupled to first data line 34, whereas source-drain terminal SD2 of transistor PG1 may be coupled to data storage node X. The series resistance between the channel region and the first data line may be represented by resistance R1, whereas the series resistance between the channel region and data storage node X may be represented by resistance R2. Resistance R2 may be substantially greater than resistance R1 (e.g., R2 may be at least 500 ohms greater than R1). As an example, resistance R1 may be 100 ohms, whereas resistance R2 may be 600 ohms or greater than 600 ohms.

In the forward mode, transistor PG1 may expose data storage node X to a high voltage level. As shown in FIG. 4, terminal SD1 may be driven high (e.g., signal BL may be precharged to Vcc during read operations or driven to Vcc during write operations), whereas terminal SD2 may be driven low (e.g., data storage node X may be held at ground by transistor PD1). Address signal WL may be asserted to turn on transistor PG1. Transistor PG1 may have a drive strength that is based on a gate-to-source voltage Vgs (e.g., a voltage difference between the voltage level at gate GC and terminal SD2).

A drain-to-source current may flow from drain SD1 to source SD2 when transistor PG1 is turned on. The voltage level of source SD2 may be proportional to the product of the drain-to-source current and resistance R2 (i.e., voltage is equal to current multiplied by resistance). The voltage level of source SD2 may therefore be high (relative to the source voltage of a transistor having symmetrically low resistance values), because resistance R2 is high (relative to nominal transistor source-drain resistance values). A high source voltage level at source SD2 will decrease gate-to-source voltage Vgs of transistor PG1. Reducing Vgs using this approach may lower the drive strength of transistor PG1 and decrease the drain-to-source current.

Weakening an access transistor when it is in the forward mode may be desirable, because cell 20 needs to be able to retain its stored content when its data storage nodes are exposed to high voltage levels through the access transistor (e.g., during read operations). Weakening access transistors PG1 and PG2 during read operations may improve the ability of the storage element of cell 20 to hold its content (e.g., weakening the access transistors during read operations may increase read margin).

In the reverse mode, transistor PG1 may be used to load a "0" into data storage node X. As shown in FIG. 5, terminal SD1 may be driven low (e.g., signal BL may be driven to Vss by write drivers during write operations), whereas terminal SD2 may be driven high (e.g., data storage node X may be held at Vcc by transistor PU1).

Address signal WL may be asserted to turn on transistor PG1. A drain-to-source current may flow from terminal SD2 to terminal SD1 when transistor PG1 is turned on. The voltage level of source terminal SD1 may be proportional to the product of the drain-to-source current and resistance R1. The voltage level of source terminal SD1 may therefore be low because resistance R1 is low (e.g., the product of the drain-to-source current and R1 is less than 50 mV). Such low source voltage at source SD1 will only affect gate-to-source voltage Vgs of transistor PG1 by a negligible amount. The drive strength of transistor PG1 is therefore relatively unaffected during the reverse mode compared to the noticeably weaker drive strength during the forward mode.

Having an access transistor with non-reduced drive strength when it is in the reverse mode may be desirable, because the access transistor needs to be sufficiently strong to overwrite cell 20 (e.g., during write operations). Maintaining the Vgs of access transistors PG1 and PG2 close to Vcc may help maximize write margin.

Other access transistors such as transistor PG2 may be formed with asymmetric source-drain resistances. For example, transistor PG2 may have source-drain terminal SD1 that is coupled to the second data line and source-drain terminal SD2 that is coupled to data storage node nX. The series resistance from the channel region of PG2 to the second data line may be equal to R1, whereas the series resistance from the channel region of PG2 to data storage node nX may be equal to R2. Resistance R2 may be substantially greater than resistance R1 for transistor PG2 (as an example).

Incorporating asymmetric address transistors in memory cell 20 improves read stability without degrading write stability (e.g., the drive strength of an asymmetric address transistor is lowered during the forward mode, whereas the drive strength of the asymmetric address transistor remains unaffected during the reverse mode). Forming memory cells with address transistors having asymmetric source-drain resistances may therefore be an effective way of optimizing the tradeoff between read margin and write margin. The use of asymmetric address transistors to provide improved read/write performance may therefore reduce the need for redundant resources for bypassing defective memory cells, thereby freeing up valuable integrated circuit real estate and reducing cost.

Asymmetric transistors may be formed by adjusting the sizes, shapes, and materials of the structures that make up the transistor. With one suitable arrangement, an asymmetric transistor can be formed by implanting the source and drain regions (sometimes referred to as oxide definition regions or source-drain diffusion regions) with different amounts of dopant.

Figure 6:
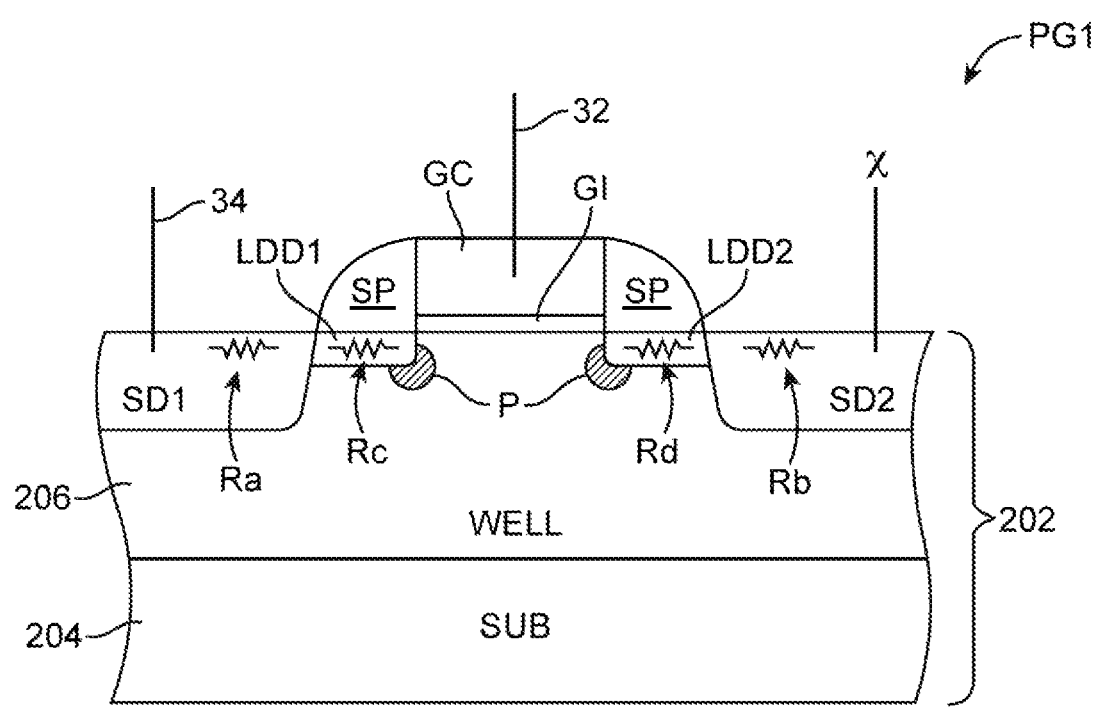
FIG. 6 is a cross-sectional side view of an illustrative access transistor with asymmetric source-drain implant doping in accordance with an embodiment of the present invention.

In FIG. 6, for example, heavily-doped drain implant region SD1 may have a first dopant concentration ranging from $10^{20}$ atoms/cm$^3$ to $10^{21}$ atoms/cm$^3$, whereas heavily doped drain implant region SD2 may have a second dopant concentration ranging from $10^{18}$ atoms/cm$^3$ to $10^{19}$ atoms/cm$^3$. Region LDD1 may have a third dopant concentration ranging from $10^{18}$ atoms/cm$^3$ to $10^{19}$ atoms/cm$^3$, whereas region LDD2 may have a fourth dopant concentration ranging from $10^{17}$ atoms/cm$^3$ to $10^{18}$ atoms/cm$^3$. Regions SD1, SD2, LDD1, and LDD2 may be implanted using n-type dopant atoms (sometimes referred to as electron donors) such as arsenic, phosphorous, etc. Doped in this way, region SD1 may have a corresponding resistivity that is equal to Ra, region SD2 may have a corresponding resistivity that is equal to Rb, region LDD1 may have a corresponding resistivity that is equal to Rc, and region LDD2 may have a corresponding resistivity that is equal to Rd (see, e.g., FIG. 6).

In general, regions with lower dopant concentrations exhibit higher resistivity compared to regions with higher dopant concentrations. Transistor PG1 may have a first overall source-drain series resistance (Ra+Rc) that is associated with the source-drain terminal connected to the first data line. Transistor PG1 may have a second overall source-drain series resistance (Rb+Rd) that is associated with the source-drain terminal connected to data storage node X. The second overall series resistance may be greater than the first overall series resistance, because regions SD2 and LDD2 have lower dopant concentrations than regions SD1 and LDD1. If desired, any number of access/address transistors may be formed using asymmetric source-drain doping to form transistors with asymmetric source-drain resistance.

In another suitable arrangement, an asymmetric transistor can be formed by using a silicide blocking mask to prevent silicide formation at the surface of a selected one of the source-drain regions in the asymmetric transistor.

Figure 7:
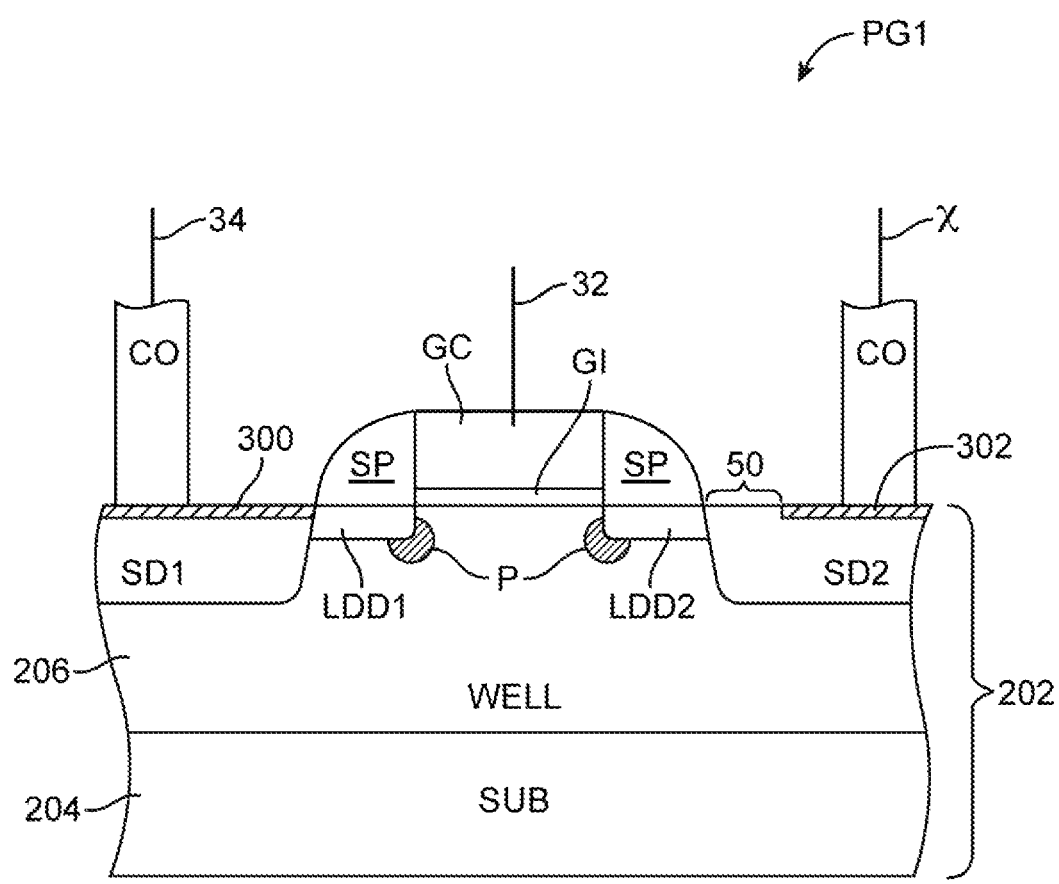
FIG. 7 is a cross-sectional side view of an illustrative access transistor with asymmetric silicide formation in accordance with an embodiment of the present invention.

In FIG. 7, for example, a first source-drain contact CO may form an electrical connection with region SD1, whereas a second source-drain contact CO may form an electrical connection with region SD2. First and second contacts CO may be metal contacts made from tungsten (as an example). First contact CO may be coupled to the first bit line 34, whereas second contact CO may be coupled to data storage node X.

As shown in FIG. 7, silicide layer 300 may be formed at the surface of substrate 202 in region SD1 (e.g., silicide layer 300 may cover an entire surface of diffusion region SD1). Silicide layer 302 may be formed at the surface of substrate 202 to cover only a portion of the surface of region SD2. A portion of diffusion region SD2 may not be covered by silicide layer 302 (see, e.g., portion 50 in FIG. 7). A silicide-block mask may be used during manufacturing processes of device 10 to prevent formation of silicide in region 50.

A silicide layer is typically used to reduce the contact resistance (e.g., an ohmic resistance at the junction of metal contact CO and associated source-drain region). A lack of silicide in region SD2 may therefore increase the contact resistance associated with second metal contact CO relative to the contact resistance associated with first metal contact CO. If desired, any number of access transistors with asymmetric source-drain silicide formation may be used in cell 20.

In another suitable arrangement, an asymmetric transistor can be formed by adjusting the co-implant (sometimes referred to as a pre-amorphization implant) dosage in the respective source-drain regions. Pre-amorphization implants may be applied prior to implanting dopant atoms. Pre-amorphization implants may help amorphize substrate 202 before implanting the dopants so that the dopants will not channel through substrate 202. The concentration of the pre-amorphization implants may affect the resistivity of the source-drain regions.

Figure 8A:
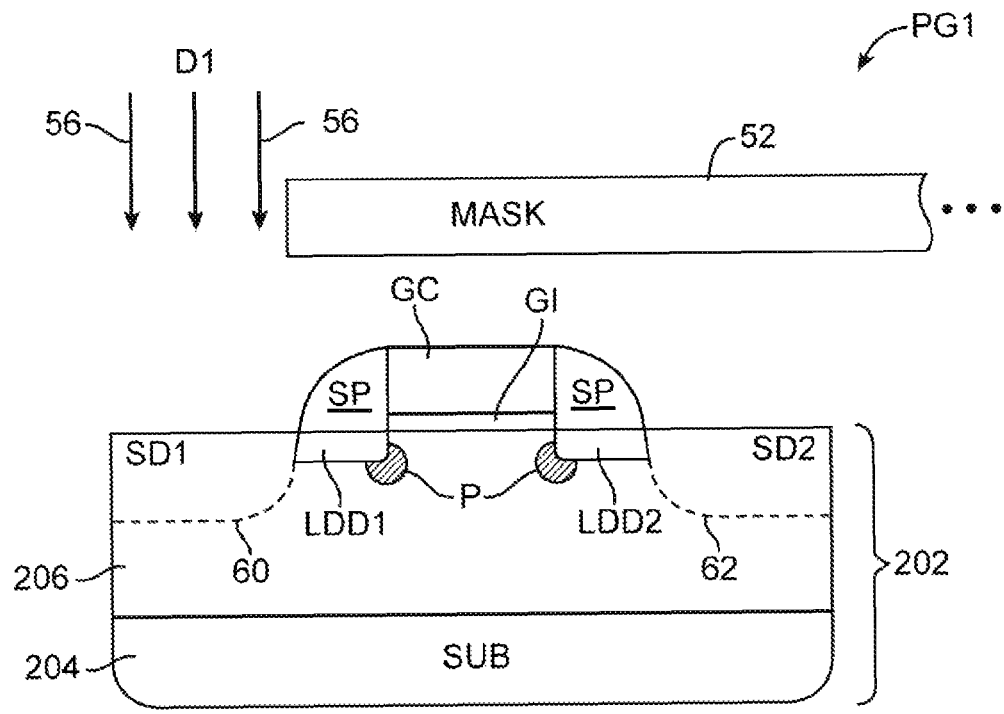
FIGS. 8A and 8B are cross-sectional side views of an illustrative access transistor formed using asymmetric pre-amorphization implants in accordance with an embodiment of the present invention.

In FIG. 8A, for example, pre-amorphization dopants D1 (e.g., a combination of arsenic with silicon, germanium, indium, carbon, or argon) may be implanted into region SD1, as indicated by arrows 56. Regions on device 10 that are covered by mask layer 52 will not receive dopants D1. Dopants D1 may be implanted into the surface of substrate 202 in exposed region SD1 down to a depth delineated by dotted line 60 (see, e.g., FIG. 8A). Dopants D1 may have a first co-implant dopant concentration ranging from $10^{20}$ atoms/cm$^3$ to $10^{21}$ atoms/cm$^3$ (as an example).

Figure 8B:
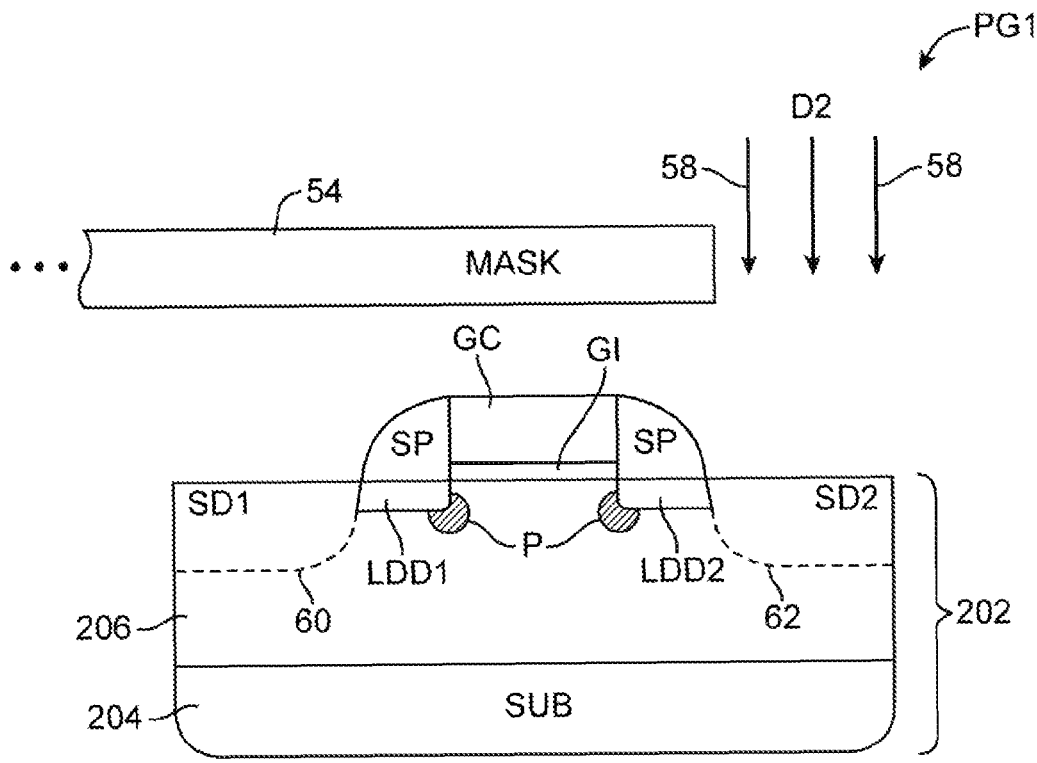

In another step as shown in FIG. 8B, pre-amorphization dopants D2 (e.g., a combination of arsenic with silicon, germanium, indium, carbon, or argon) may be implanted into region SD2, as indicated by arrows 58. Regions on device 10 that are covered by mask layer 54 will not receive dopants D2. Dopants D2 may be implanted into the surface of substrate 202 in exposed region SD2 down to a depth as delineated by dotted line 62 (see, e.g., FIG. 8B). Dopants D2 may have a second co-implant dopant concentration ranging from $10^{18}$ atoms/cm$^3$ to $10^{19}$ atoms/cm$^3$ (as an example). If desired, the partial deposition of silicide layers 300 and 302 in FIG. 7 may also be formed using masks that cover at least portion 50.

As described in connection with FIG. 6, regions with lower dopant concentrations will have higher resistivity compared to regions with higher dopant concentrations. The resistance associated with region SD2 will therefore be greater than the resistance associated with region SD1, because region SD2 has been implanted with fewer dopant atoms than region SD1 (i.e., the second co-implant dopant concentration is less than the first co-implant dopant concentration). If desired, any number of access transistors may be formed using asymmetric source-drain pre-amorphization implants to form transistors with asymmetric source-drain resistance.

Figure 9:
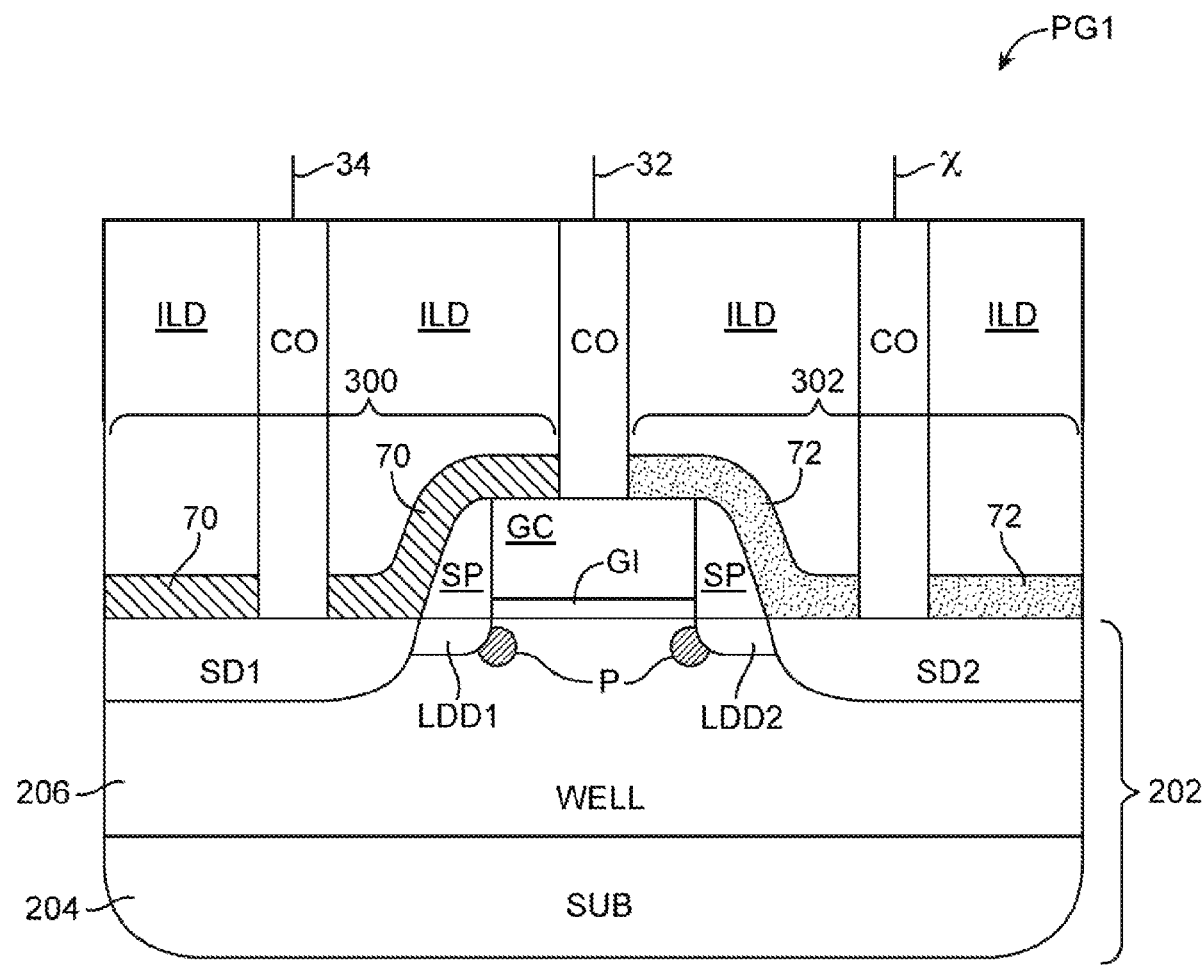
FIG. 9 is a cross-sectional side view of an illustrative access transistor with stress layers of different types in accordance with an embodiment of the present invention.

In another suitable arrangement, an asymmetric transistor may include different types of stress layers formed over transistor PG1. As shown in FIG. 9, for example, stress layer 70 of a first type may be selectively formed over region 300 (e.g., a region associated with region SD1 of the access transistor), whereas stress layer 72 of a second type may be selectively formed over region 302 (e.g., a region associated with region SD2 of the access transistor). Layers 70 and 72 may serve as etch stop layers and may be formed using silicon nitride and other types of etch stop layer. Interlayer dielectric material ILD (e.g., oxide) may be formed over layers 70 and 72 and around contacts CO (see, e.g., FIG. 9).

In some arrangements, layers 70 and 72 may be removed before forming the ILD layers. If layers 70 and 72 are removed, the stress induced by layers 70 and 72 may remain even after the layers are remove.

For example, layer 70 may induce tensile stress on the channel region of the transistor, whereas layer 72 may induce compressive stress on the channel region of the transistor. Layer 70 need not provide any particular type of stress, if desired.

Forming different types of stress-inducing layers such as layers 70 and 72 over an access transistor may cause the access transistor to exhibit asymmetric behaviors. In particular, compressive stress layer 72 formed over region SD2 of n-channel transistor PG1 and tensile stress layer 70 formed over region SD1 of n-channel transistor PG1 may cause transistor PG1 to be stronger in the reverse mode (e.g., when passing a "0" from SD1 to SD2) and weaker in the forward mode (e.g., when exposing SD2 to a high precharge voltage). If desired, any number of access transistors may be formed using stress layers of different types to form transistors with asymmetric source-drain resistance.

In another suitable arrangement, an asymmetric transistor can be formed by manufacturing source-drain contacts of different sizes.

Figure 10:
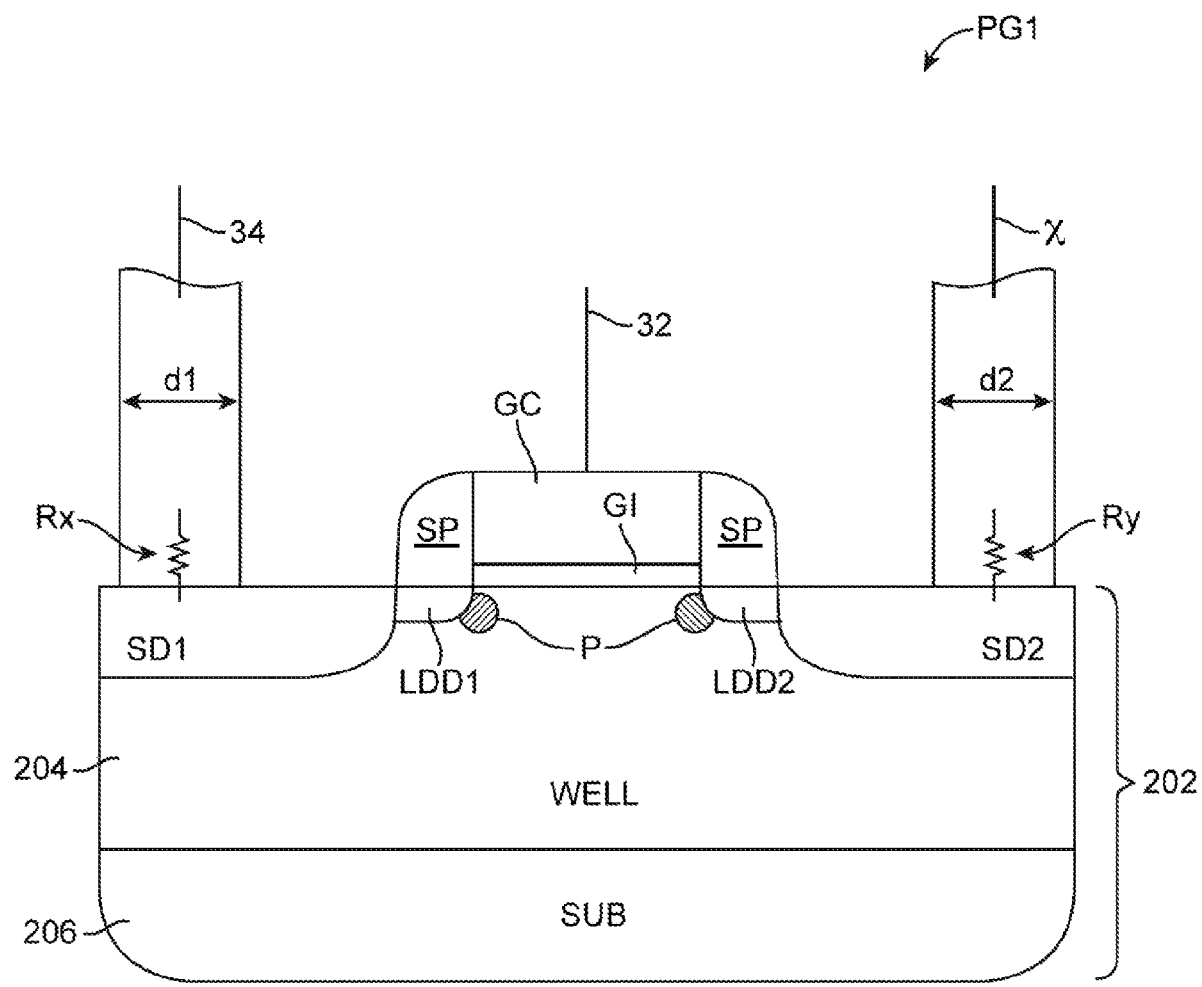
FIG. 10 is a cross-sectional side view of an illustrative access transistor with source-drain contacts of different sizes in accordance with an embodiment of the present invention.

As shown in FIG. 10, for example, the first contact (sometimes referred to as contact plugs or contact vias) coupled to data line 34 may have a first diameter d1, whereas the second contact coupled to data storage node X may have a second diameter d2. The contact resistance associated with the first contact may be represented by resistance Rx, whereas the contact resistance associated with the second contact may be represented by resistance Ry.

In general, contact plugs with larger diameters provide lower contact resistance values compared to contact vias with smaller diameters. In the example of FIG. 10, diameter d1 of the first contact may be greater than diameter d2 of the second contact (e.g., the first contact may contact SD1 over a first area, whereas the second contact may contact SD2 over a second area that is smaller than the first area). Diameter d2 may, for example, be no more than 90% of d1, 80% of d1, 70% of d1, etc. As a result, resistance Rx may be less than Ry. If desired, any number of access transistors may be formed using asymmetric source-drain contacts to form transistors with asymmetric source-drain resistance.

Figure 11:
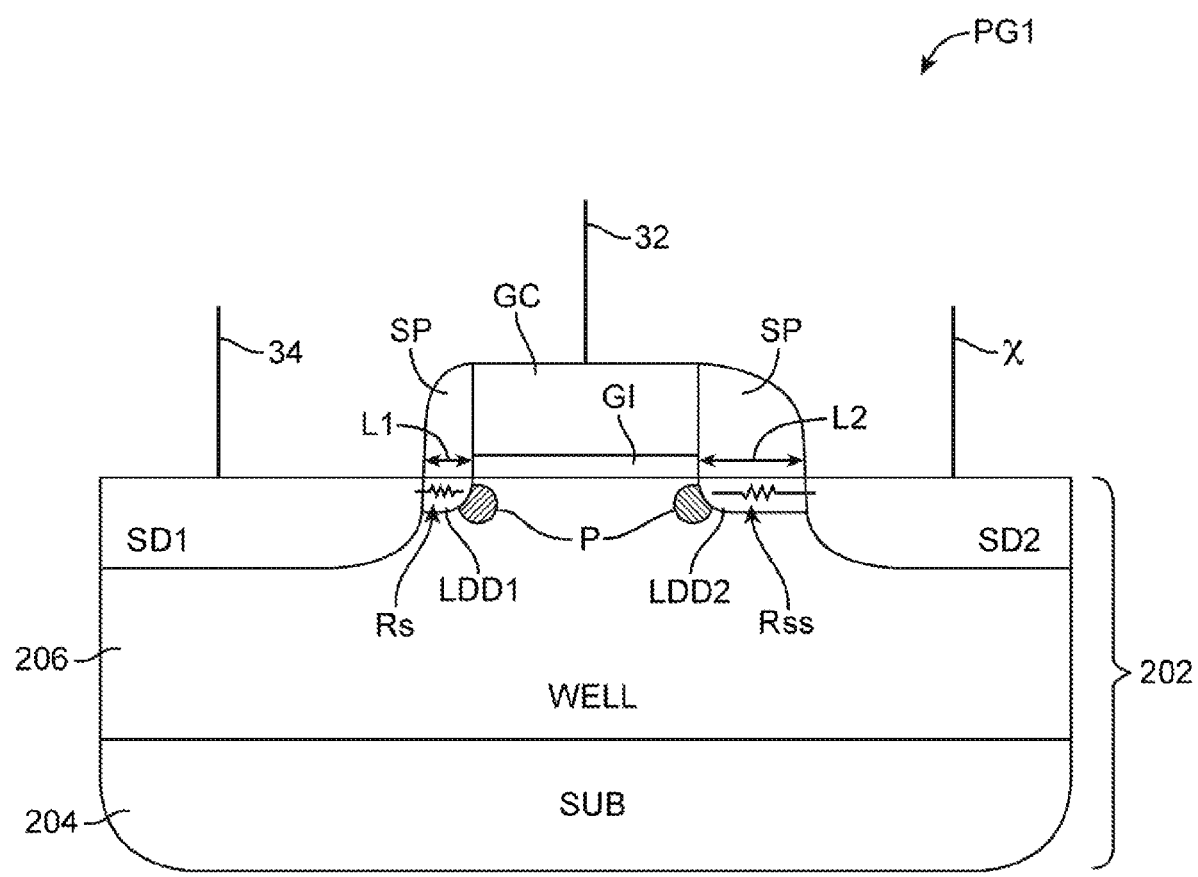
FIG. 11 is a cross-sectional side view of an illustrative access transistor with asymmetric spacers in accordance with an embodiment of the present invention.

In another suitable arrangement, an asymmetric transistor may include spacers of different sizes. As shown in FIG. 11, for example, first spacer SP adjacent to region SD1 may have a first length L1 (e.g., a horizontal distance from gate insulator GI to region SD1), whereas second spacer SP adjacent to region SD2 may have a second length L2 (e.g., a horizontal distance from gate insulator GI to region SD2). The lengths of regions LDD1 and LDD2 may depend on the lengths of their respective spacers, because the lightly-doped drain (LDD) regions are formed under the spacers. The series resistance associated with region LDD1 under the first spacer may be Rs, whereas the series resistance associated with region LDD2 under the second spacer may be Rss (see, e.g., FIG. 11).

In general, LDD regions with greater lengths exhibit higher series resistance compared to LDD regions with smaller lengths. In the example of FIG. 11, length L2 may be at least 10% greater than L1, at least 20% greater than L1, etc. As a result, resistance Rss may be sufficiently higher than Rs to provide desired drive strengths during the forward and reverse modes. If desired, any number of access transistors may be formed using asymmetric spacers of different sizes to form transistors with asymmetric source-drain resistance.

Figure 12:
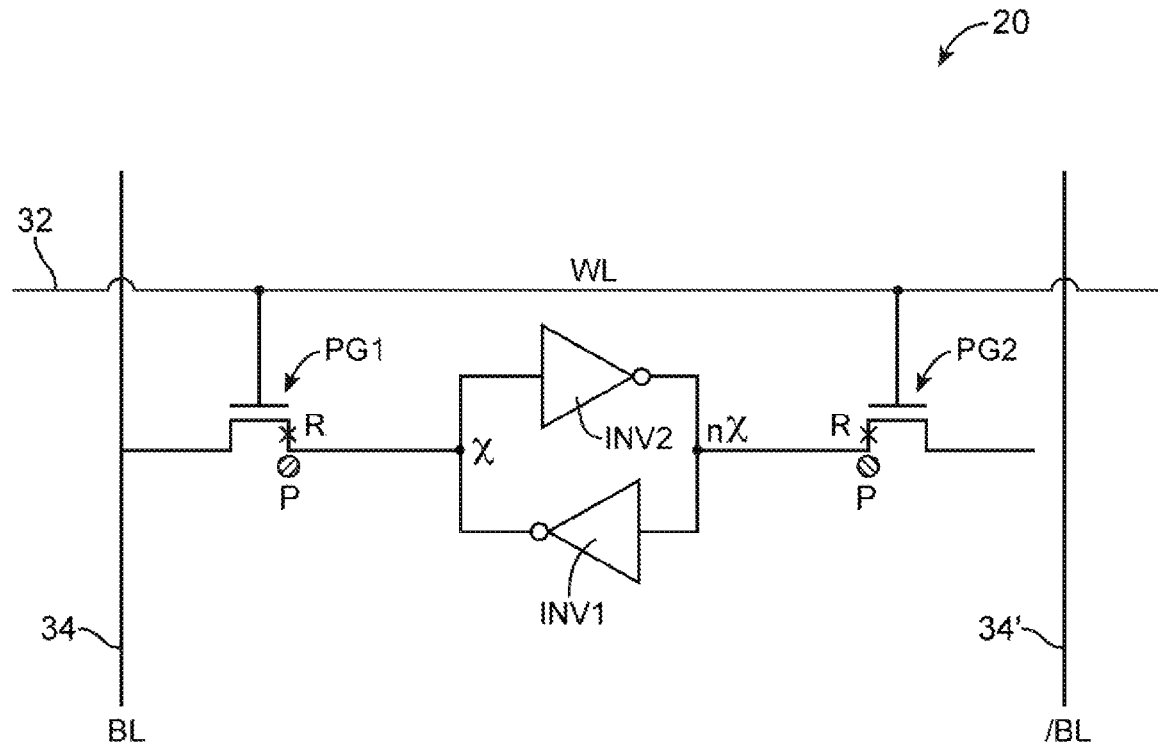
FIG. 12 is a circuit diagram of an illustrative memory cell formed using asymmetric access transistors in accordance with an embodiment of the present invention.

FIG. 12 is a circuit diagram of memory cell 20 with asymmetric address transistors formed using asymmetric source-drain resistances and asymmetric pocket implants. As shown in FIG. 12, transistors PG1 and PG2 may each have higher series/contact resistance and pocket implant P at the source-drain terminal coupled to a data storage node. For example, transistor PG1 may have a first source-drain coupled to first data line 34 and a second source-drain coupled to data storage node X. The second source-drain of PG1 may exhibit higher resistivity than the first source-drain. Pocket implant P may only be implanted at the second source-drain region of PG1. Similarly, transistor PG2 may have a first source-drain coupled to second data line 34' and a second source-drain coupled to data storage node nX. The second source-drain of PG2 may exhibit higher resistivity than the first source-drain of transistor PG2. Pocket implant P may only be implanted at the second source-drain region of transistor PG2.

Address transistors having asymmetric resistance values formed using this approach may provide a first drive strength when passing a "0" into corresponding data storage nodes (e.g., during reverse mode) and a second drive strength when exposing the data storage nodes to high precharge voltage levels (e.g., during forward mode). The first drive strength may be greater than the second drive strength (e.g., address transistors operating the forward mode are weaker than address transistors operating in the reverse mode).

Performing pocket implants only at the source-drain regions connected to the data storage nodes may elevate the energy barrier at those regions. Elevating energy barrier levels in this way may result in access transistors being more capable of passing a "0" into corresponding data storage nodes and less likely to cause a read disturb. Forming memory cells 20 with asymmetric source-drain resistances and asymmetric pocket implants may therefore exhibit improved read/write margins. If desired, other known techniques of improving read/write stability (e.g., adjusting the power supply voltages of cell 20, adjusting the magnitude of control signal WL, adjusting the sizes of transistors in cell 20, forming cell 20 using additional inverters or inverter-like circuits, etc.) may be used in conjunction with the asymmetric address transistors described in connection with FIGS. 3-12.

The foregoing is merely illustrative of the principles of this invention and various modifications can be made by those skilled in the art without departing from the scope and spirit of the invention.

What is claimed is:

1. An asymmetric transistor comprising:
   a gate conductor;
   a first source-drain region formed in a semiconductor substrate and having a first resistivity;
   a second source-drain region formed in the semiconductor substrate and having a second resistivity that is different than the first resistivity; and
   a channel region under the gate conductor that is interposed between the first and second source-drain regions, wherein the first and second source-drain regions comprise lightly doped drain implant regions and heavily doped drain implant regions and wherein the heavily doped drain implant region of the first source-drain region has a different dopant concentration than the heavily doped drain implant region of the second source-drain region.

2. The asymmetric transistor defined in claim 1, wherein the first source-drain region has a dopant concentration that is higher than a dopant concentration of the second source-drain region.

3. The asymmetric transistor defined in claim 1 wherein the lightly doped drain implant region of the first source-drain region has a different dopant concentration than the lightly doped drain implant region of the second source-drain region.

4. The asymmetric transistor defined in claim 1, wherein the lightly doped drain implant regions are adjacent to the channel region and wherein the lightly doped drain implant region of the first source-drain region has a different dopant concentration than the lightly doped drain implant region of the second source-drain region.

5. The asymmetric transistor defined in claim 1, wherein the asymmetric transistor comprises a memory cell access transistor for a memory cell having a bistable storage element, wherein the second source-drain region has a lower dopant concentration than the first source-drain region, and wherein the second source-drain region is coupled to the bistable storage element.

6. The asymmetric transistor defined in claim 1 further comprising:
an asymmetric pocket implant adjacent to the channel region.

7. The asymmetric transistor defined in claim 1 wherein the first source-drain region has a first dopant concentration between $10^{20}$ atoms/cm$^3$ and $10^{21}$ atoms/cm$^3$, and wherein the second source-drain region has a second dopant concentration between $10^{18}$ atoms/cm$^3$ and $10^{18}$ atoms/cm$^3$.

8. The asymmetric transistor defined in claim 1 wherein the lightly doped drain implant regions of the first and second source-drain regions are adjacent to the channel region, wherein the heavily doped drain implant region of the first source-drain region has a first dopant concentration between $10^{20}$ atoms/cm$^3$ and $10^{21}$ atoms/cm$^3$, and wherein the heavily doped drain implant region of the second source-drain region has a second dopant concentration between $10^{18}$ atoms/cm$^3$ and $10^{19}$ atoms/cm$^3$.

9. The asymmetric transistor defined in claim 8 wherein the lightly doped drain implant region of the first source-drain region has a third dopant concentration between $10^{18}$ atoms/cm$^3$ and $10^{19}$ atoms/cm$^3$.

10. The asymmetric transistor defined in claim 9 wherein the lightly doped drain implant region of the second source-drain region has a fourth dopant concentration between $10^{17}$ atoms/cm$^3$ and $10^{18}$ atoms/cm$^3$.

11. The asymmetric transistor defined in claim 8 wherein the lightly doped drain implant regions and heavily doped drain implant regions of the first and second source-drain regions are doped with n-type dopants.

12. The asymmetric transistor defined in claim 1 wherein the lightly doped drain implant region of the first source-drain region has a first resistivity, wherein the heavily doped drain implant region of the first source-drain region has a second resistivity, wherein the lightly doped drain implant region of the second source-drain region has a third resistivity, and wherein the heavily doped drain implant region of the second source-drain region has a fourth resistivity.

13. The asymmetric transistor defined in claim 12 wherein the first and second resistivity of the first source-drain region form a first combined resistance and wherein the third and fourth resistivity of the second source-drain region form a second combined resistance that is greater than the first combined resistance of the first source-drain region.

14. An asymmetric transistor comprising:
a gate conductor;
a first source-drain region formed in a semiconductor substrate and having a first dopant concentration, wherein the first source-drain region includes a lightly-doped implant region and a heavily-doped implant region;
a second source-drain region formed in the semiconductor substrate and having a second dopant concentration that is different form the first dopant concentration, wherein the second source-drain region includes a lightly-doped implant region and a heavily-doped implant region;
a channel region under the gate conductor that is interposed between the first and second source-drain regions;
a gate structure that covers the channel region; and
first and second dielectric spacers adjacent to the gate structure, wherein the lightly doped implant regions of the first and second source-drain regions are substantially covered by the first and second dielectric spacers.

15. The asymmetric transistor defined in claim 14 wherein the first and second source-drain regions are implanted with n-type dopant atoms.

16. The asymmetric transistor defined in claim 15 wherein the asymmetric transistor comprises a memory cell access transistor for a memory cell having a bistable storage element.

17. The asymmetric transistor defined in claim 14 further comprising:
an asymmetric pocket implant adjacent to the channel region.

18. The asymmetric transistor defined in claim 17 wherein the asymmetric transistor comprises a memory cell access transistor for a memory cell having a data storage node, wherein the second source-drain region is interposed between the first source-drain region and the data storage node, and wherein the asymmetric pocket implant is formed at the second source-drain region.

19. The asymmetric transistor defined in claim 18 wherein the lightly doped drain implant region of the first source-drain region has a greater dopant concentration than the lightly doped drain implant region of the second source-drain region.

20. The asymmetric transistor defined in claim 14 wherein the first and second dielectric spacers each have a first width and wherein the lightly doped implant regions of the first and second source-drain regions have a second width that is equal to the first width.

* * * * *